Dec. 2, 1969 C. HOPPER, JR 3,482,198
PHOTOSENSITIVE DEVICE
Filed Oct. 29, 1964

INVENTOR:
CLAUDE HOPPER, JR.
BY Henry T. Olsen
HIS ATTORNEY.

3,482,198

PHOTOSENSITIVE DEVICE

Claude Hopper, Jr., Owensboro, Ky., assignor to General Electric Company, a corporation of New York Filed Oct. 29, 1964, Ser. No. 407,384
Int. Cl. H01c 7/08
U.S. Cl. 338—19 3 Claims

ABSTRACT OF THE DISCLOSURE

A photosensitive device which comprises a sealed envelope having a base portion, an insulative substrate having a photoconductive coating thereon mounted within the envelope and means, which is preferably deformable, providing a high heat conductivity path between the substrate and the envelope.

This invention relates to photosensitive devices and more particularly to photosensitive devices of the photoconductive type.

With photosensitive devices such as photoconductive cells, the acceptability of the cell for many applications is determined by the amount of current the cell may usefully handle. It is an object of this invention to provide an improved relatively high current carrying photoconductive cell.

Since a photoconductive cell made, for example, of cadmium, sulphite or cadmium selenide rapidly degrades when the active surface of the cell exceeds approximately 110° C., the current carrying capacity of these cells is, to a major degree, governed by its ability to dissipate heat produced by the resistance heating of the cell.

It is another object of this invention to provide a photoconductive cell having means for efficiently conducting heat away from the active surface of the cell. It is a further object of this invention to provide a photosensitive device having means providing a high heat conductivity path between the element of the cell carrying the photosensitive material and the envelope in which it is contained, whereby the heat may be rapidly transferred from the area adjacent the active surface of the cell to the envelope from which in turn it may be transferred to a heat sink provided in the environment in which the photosensitive device is to be used.

In accordance with the aforementioned objects there is provided a photosensitive device which comprises a sealed envelope having a base portion, an insulative substrate having a photoconducitve coating thereon mounted within the envelope and means, which is preferably deformable, providing a high heat conductivity path between the substrate and the envelope. In accordance with further aspects of the invention the said means for providing the high heat conductivity path comprises a shim of high thermal conductivity material interposed between the substrate and the envelope.

Further objects and advantages of the invention shall be understood from the following complete specification and from the drawings wherein.

Figure 1:
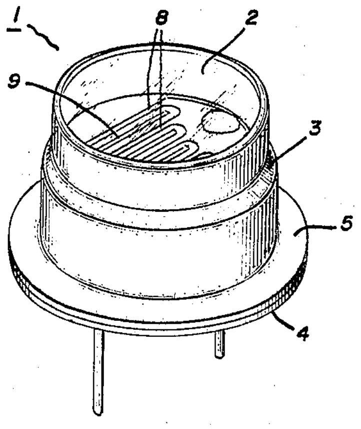
FIG. 1 is a perspective view of a photosensitive device of the type to which the invention relates.
Figure 2:
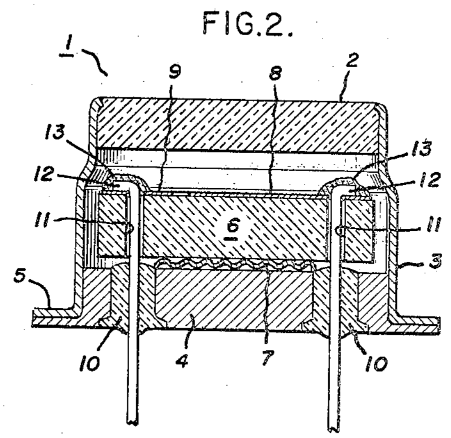
FIG. 2 is a longitudinal cross-sectional view thereof.

As shown in FIG. 1 the photosensitive device of my invention comprises an envelope 1 having a light transmitting portion 2. As shown in FIG. 2, the envelope 1 further includes a shell portion 3 and a base portion 4, said last-mentioned portions being of metal, the said portions 3 and 4 being suitably joined at matrix flanges 5, as shown, as by welding to form a vacuum-tight seal. The light transmitting portion 2 is vacuum sealed to the upper end of shell portion 3 by any suitable glass-metal seal.

A substrate 6 of insulative material such as ceramic is mounted within the envelope and a deformable means 7 for providing a high thermal conductivity path of deformable material is juxtapositioned between the base portion 4 of the envelope 1 and the substrate 6. A coating 8 of photosensitive material, such as cadmium sulphide or cadmium selenide, is provided on the surface of the substrate 6 and on both sides of the photosensitive coating 8 are conductive coatings 9 which may be of various materials, for example, indium, which coatings are in ohmic contact with the photosensitive coating 8. Conductive leads 12 are hermetically secured in the base portion of the device by insulative seals 10 and extend upwardly through apertures 11 in the substrate 6. The inner ends of the lead-in conductors 12 are bent so as to overlie and contact the conductive coatings 9 and a conductive epoxy resin material 13 can be used to mechanically secure the leads to the substrate and assure good electrical connection between the coatings 9 and leads 12.

The high heat conductive means 7 is vertically disposed beneath the coating 8 of photosensitive material and is interposed directly between one surface of the substrate 6 and the adjacent surface of the base portion 4 of the envleope. The heat conductive means comprises a shim 14 (FIG. 3) of a material having a high thermal conductivity, for example, copper or aluminum. The shim preferably has a variegated cross section which provides a plurality of points or areas which will be in intimate contact with the adjacent surface of the substrate 6 and the internal surface of the base portion 4 of the envelope, respectively. The high heat conductive means 7 may be of thermosetting epoxy which will conform the surfaces of the substrate and base portion.

Figure 3:
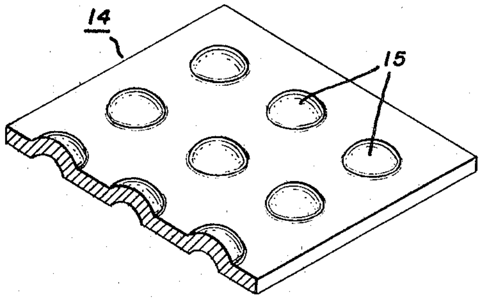
FIG. 3 is an enlarged perspective view partly in section, of the shim means.

As shown in FIG. 3, the shim 14 may take the form of sheet having a plurality of dimples 15 regularly spaced over the surface area thereof. The shim 14 is preferably of thin foil material approximately 1 to 5 mils in thickness so that shim will become deformed and maintain intimate broad-area contact with both the substrate 6 and base portion 4, even where one or the other of the substrate 6 or base portion 4 may have irregularities on its surface. While a flat thin foil of high thermal conductivity material may be used to carry out the invention, since it will compensate for irregularities on the substrate 6 and on the base portion 4, a foil of variegated cross section is preferred since it assures an intimate contact between the substrate on one side and the base portion on the other side. The variegations used to carry out the invention may be in various forms in addition to the dimpled structure shown. For example, the foil may be corrugated; or cross-corrugated forming a type of quilted structure; or merely randomly crinkled.

Devices constructed in accordance with the invention have been shown to have greatly improved heat dissipation and hence a higher current carrying capability. Even when the photosensitive device is used in low current carrying applications, the high heat dissipation structure has advantage since it reduces the temperature of the active photosensitive area hence increases the stability of the device.

While the invention has been disclosed by way of the preferred embodiment thereof, it will be understood that various modifications and adaptations of the invention may be made without departing therefrom. Therefore, the appended claims are intended to cover all such modifications and adaptations as fall within the true spirit and scope of the invention.

What is claimed as new and desired to be secured by Letters Patent of the United States is:

1. A photocell comprising a sealed envelope having a base portion, an insulative substrate having a photoconductive coating thereon mounted within said envelope, and a shim of high heat conductivity foil having a variegated cross-section interposed between said substrate and said base portion, whereby a high heat conductivity path is provided between the substrate and said base portion.

2. A photocell comprising a sealed envelope having a base portion, an insulative substrate having a photoconductive coating on a portion thereof mounted within said envelope, and a shim of high heat conductivity foil having a variegated cross section underlying that portion of the substrate provided with the photoconductive coating.

3. A photoconductive device comprising a sealed envelope including a base header portion of high thermal conductivity material, a light transmitting portion, and a shell portion interconnecting said base portion and said light transmitting portion; a pair of conductive leads sealingly secured in and extending through said base portion; a ceramic substrate mounted within said envelope and juxtapositioned adjacent said base portion, said substrate having on a central portion thereof a coating of photoconductive material and coatings of conductive material adjacent the photoconductive material; means establishing electrical connection between said leads and said conductive coatings including a pair of apertures in said substrate into which said leads extend, the ends of said leads being bent to overlie and engage said conductive coatings, and a conductive epoxy resin forming an electrical and mechanical bond therebetween; and means providing a high thermal conductivity path between the substrate and said base portion comprising a shim interposed between said substrate and said base portion and in intimate thermal connection therewith, said shim underlying at least that portion of the substrate opposite said photoconductive coating, and said shim being of thin foil material having a high thermal conductivity and of a variegated cross-section whereby good thermal connection is made to both the substrate and to the base portion.

References Cited

UNITED STATES PATENTS

| | | | |
|---|---|---|---|
| 2,629,802 | 2/1953 | Pantchechnikoff | 338—15 X |
| 2,714,694 | 8/1955 | Drubrig et al. | |
| 3,208,022 | 9/1965 | Sihvonen et al. | 338—15 |
| 3,227,885 | 1/1966 | Hirai et al. | 250—238 |

LEWIS H. MYERS, Primary Examiner

D. A. TONE, Assistant Examiner

U.S. Cl. X.R.

258—238; 317—100, 234